United States Patent
Xiao

(10) Patent No.: US 11,366,362 B2
(45) Date of Patent: Jun. 21, 2022

(54) PIXEL ELECTRODE, ARRAY SUBSTRATE AND DEVICE

(71) Applicant: WUHAN CHINA STAR OPTOELECTRONICS TECHNOLOGY CO., LTD., Hubei (CN)

(72) Inventor: Shidi Xiao, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 253 days.

(21) Appl. No.: 16/607,254

(22) PCT Filed: Aug. 22, 2019

(86) PCT No.: PCT/CN2019/101901
§ 371 (c)(1),
(2) Date: Oct. 22, 2019

(87) PCT Pub. No.: WO2020/258478
PCT Pub. Date: Dec. 30, 2020

(65) Prior Publication Data
US 2021/0333602 A1   Oct. 28, 2021

(30) Foreign Application Priority Data

Jun. 25, 2019   (CN) .......................... 201910557367.6

(51) Int. Cl.
*G02F 1/1343* (2006.01)
*G02F 1/1333* (2006.01)
(Continued)

(52) U.S. Cl.
CPC ........ *G02F 1/13439* (2013.01); *G02F 1/1368* (2013.01); *G02F 1/136227* (2013.01); *H01L 27/124* (2013.01)

(58) Field of Classification Search
CPC ......... G02F 1/133707; G02F 1/134309; G02F 1/1368; G02F 1/133345; G02F 1/134363;
(Continued)

(56) References Cited

U.S. PATENT DOCUMENTS 7,345,728 B2 *  3/2008  Lee ................... G02F 1/134363
                                                         349/141
8,149,367 B2 *  4/2012  Tanno ............... G02F 1/134363
                                                         349/139
(Continued)

FOREIGN PATENT DOCUMENTS

CN       101446717 A      6/2009
CN       101825812 A      9/2010
(Continued)

*Primary Examiner* — Thoi V Duong

(57) ABSTRACT

A pixel electrode, an array substrate, and a display device are disclosed. The pixel electrode includes electrode regions and at least one hollow region distributed between the electrode regions. The hollow region includes a main body part and two ending parts located at two ends of the main body part, at least one ending part is an inflated portion having a width, and a width of the main body part is smaller than the width of the inflated portion. By using the present disclosure, the transparence is improved and the contrast and the power consumption are improved accordingly.

10 Claims, 2 Drawing Sheets

(51) Int. Cl.
*G02F 1/1368* (2006.01)
*G02F 1/1362* (2006.01)
*H01L 27/12* (2006.01)

(58) Field of Classification Search
CPC ........... G02F 1/13439; G02F 1/134318; G02F
1/136227; G02F 1/1343; G02F 1/1333;
G02F 1/13685; G02F 1/133357; G02F
2201/121; G02F 2201/122; H01L 27/124
See application file for complete search history.

(56) References Cited

U.S. PATENT DOCUMENTS

| | | | |
|---|---|---|---|
| 2005/0068483 A1 | 3/2005 | Lee et al. | |
| 2008/0316414 A1 | 12/2008 | Nakagawa et al. | |
| 2009/0115951 A1 | 5/2009 | Jun et al. | |
| 2010/0182555 A1 | 7/2010 | Kimura et al. | |
| 2012/0327352 A1* | 12/2012 | Uyama | G02F 1/134363 349/141 |
| 2015/0205148 A1* | 7/2015 | Asakwa | G02F 1/1368 349/43 |
| 2016/0306238 A1 | 10/2016 | Huh et al. | |
| 2017/0212394 A1* | 7/2017 | Araki | G02F 1/134309 |
| 2017/0293191 A1* | 10/2017 | Tomioka | G02F 1/1368 |
| 2018/0031931 A1 | 2/2018 | Qin | |
| 2020/0184909 A1* | 6/2020 | Murata | G02F 1/1337 |

FOREIGN PATENT DOCUMENTS

| | | |
|---|---|---|
| CN | 103852942 A | 6/2014 |
| CN | 105867037 A | 8/2016 |

\* cited by examiner

PIXEL ELECTRODE, ARRAY SUBSTRATE AND DEVICE

CROSS REFERENCE TO RELATED APPLICATION

This application is a US national phase application based upon an International Application No. PCT/CN2019/101901, filed on Aug. 22, 2019, which claims priority to Chinese Application No. 201910557367.6, filed Jun. 25, 2019. The entire disclosure of the above application is incorporated herein by reference.

FIELD OF THE INVENTION

The present invention relates to display field, and more particularly to a pixel electrode, an array substrate, and a display device.

BACKGROUND OF THE INVENTION

Due to the limitations of design and manufacture capabilities, in a conventional pixel electrode, the ends of the hollow region has a smaller openings such that the two ends of the hollow region occupy the gap between two pixels electrodes. In this way, the effective electrical field is reduced such that the distribution of the liquid crystals of the pixel is affected such that the transparence of the entire panel is reduced.

SUMMARY OF THE INVENTION

One objective of an embodiment of the present invention is to provide a pixel electrode, a array substrate and a display device, to solve the above-mentioned problems of reducing the effective electrical field, affecting distribution of the liquid crystals of the pixel, and reducing the transparence.

According to an embodiment of the present invention, a pixel electrode is disclosed. The pixel electrode comprises electrode regions and at least one hollow region distributed between the electrode regions. The hollow region comprises a main body part and two ending parts located at two ends of the main body part, at least one ending part is an inflated portion having a width, and a width of the main body part is smaller than the width of the inflated portion.

Furthermore, the inflated portion has a curved shape.

Furthermore, the two ending parts are both inflated portions.

Furthermore, the other ending part of the two ending parts extends to the electrode regions and forms a hollowed gap.

Furthermore, the electrode regions form a corner at the gap, and an edge of the corner has a curved shape.

According to another embodiment of the present invention, a array substrate is included. The array substrate comprises the above-mentioned pixel electrode.

Furthermore, the array substrate includes a thin film transistor (TFT) structure layer, a flat layer positioned on the TFT structure layer, and a passivation layer, positioned on the flat layer. The pixel electrode is positioned on the passivation layer.

Furthermore, the TFT structure layer comprises a source/drain layer, the flat layer comprises a first via, the passivation layer has a second via, the first via corresponds to the second via, the pixel electrode is coupled to the source/drain layer through the first via and the second via.

Furthermore, an aperture of the first via is less than 7 microns and an aperture of the second via is less than 5 microns.

According to another embodiment of the present invention, a display device is included. The display device comprises the above-mentioned pixel electrode.

The present invention provides a pixel electrode. Through the redesign of the two ends of the pixel electrode, the distribution of the liquid crystals at the edge is more effective such that the transparence is improved and the contrast and the power consumption are improved accordingly. In addition, the present invention provides a array substrate. The via of certain layers is adjusted according to the increase of the two ending parts of the hollow regions of the pixel electrode. This could reduce the dark lines and raises the transparence.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF PREFERRED EMBODIMENTS

Figure 1:
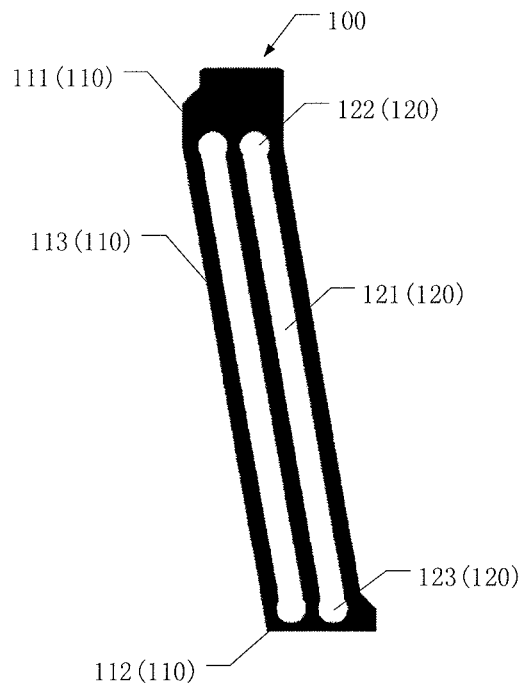
FIG. 1 is a diagram of a pixel electrode according to a first embodiment of the present invention.

The invention is described below in detail with reference to the accompanying drawings, wherein like reference numerals are used to identify like elements illustrated in one or more of the figures thereof, and in which exemplary embodiments of the invention are shown. This invention may, however, be embodied in many different forms and should not be construed as limited to the particular embodiments set forth herein. Rather, these embodiments are provided so that this disclosure will be thorough and complete, and will fully convey the scope of the invention to those skilled in the art.

It is understood that terminologies, such as "center," "longitudinal," "horizontal," "length," "width," "thickness," "upper," "lower," "before," "after," "left," "right," "vertical," "horizontal," "top," "bottom," "inner," "outer," "clockwise," and "counterclockwise," are locations and positions regarding the figures. These terms merely facilitate and simplify descriptions of the embodiments instead of indicating or implying the device or components to be arranged on specified locations, to have specific positional structures and operations. These terms shall not be construed in an ideal or excessively formal meaning unless it is clearly defined in the present specification. In addition, the term "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural" is two or more, unless otherwise specifically defined.

All of the terminologies containing one or more technical or scientific terminologies have the same meanings that persons skilled in the art understand ordinarily unless they are not defined otherwise. For example, "arrange," "couple," and "connect," should be understood generally in the embodiments of the present disclosure. For example, "firmly connect," "detachably connect," and "integrally connect" are all possible. It is also possible that "mechanically connect," "electrically connect," and "mutually communicate" are used. It is also possible that "directly couple," "indirectly couple via a medium," and "two components mutually interact" are used.

Embodiment 1

A pixel electrode 100 is provided. The pixel electrode 100 is in bar shape.

Please refer to FIG. 1, which is a diagram of a pixel electrode according to a first embodiment of the present invention. As shown in FIG. 1, in this embodiment, the pixel electrode 100 comprises an electrode region 110 and two hollow regions 120. The hollow regions 120 are uniformly distributed within the electrode region 110. The electrode region 110 is around the hollow regions 120.

The electrode region 110 comprises a first contact part 111, a second contact part 112 and three connecting parts 113. The connecting parts 113 are in a bar shape and are parallel to each other. In addition, the connecting parts 113 and the hollow regions 120 are positioned in turns. The first contact part 111 and the second contact part 112 are respectively positioned at two ends of the connecting parts 113. The first contact part 111 and the second contact part 112 are used to connect to the structure layer of the array substrate and the connecting part 113 is used to transmit currents.

The hollow regions 120 are uniformly distributed within the pixel electrode 100 and parallel to each other. Each of the hollow regions 120 comprises a main body part 121 and ending parts 122 and 123 respectively positioned at two ends of the main body part 121. The main body part 121 is in bar shape and has a width. The ending parts 122 and 123 at the two ends of the hollow region 120 are both inflated portions. The inflated portion has a width. The width of the main body part 121 is less than the width of the ending parts 122 and 123. Further, the above-mentioned inflated portions have a curved shape. The hollow region 120 is used to provide lights to the display panel because the light generated from the backlight could pass through the hollow region 120.

The material of the pixel electrode 100 is Indium tin oxide (ITO). The pixel electrode 100 improves the distribution of the liquid crystals through enlarging the ending parts 122 and 123 at the two ends of the hollow regions 120. This also reduces the dark lines of the display region and increases the transparence of the display.

In this embodiment, the pixel electrode 100 is a one-pixel dual-domain structure. This is not a limitation of the present invention. In another embodiment, the pixel electrode 100 could be another structure, such as dual-pixel dual-domain structure. In such structure, the implementation of the hollow region and the electrode region could be similar to those in the above-mentioned pixel electrode 100 and thus further illustrations are omitted here. Other modifications also fall within the scope of the present invention.

Figure 4:
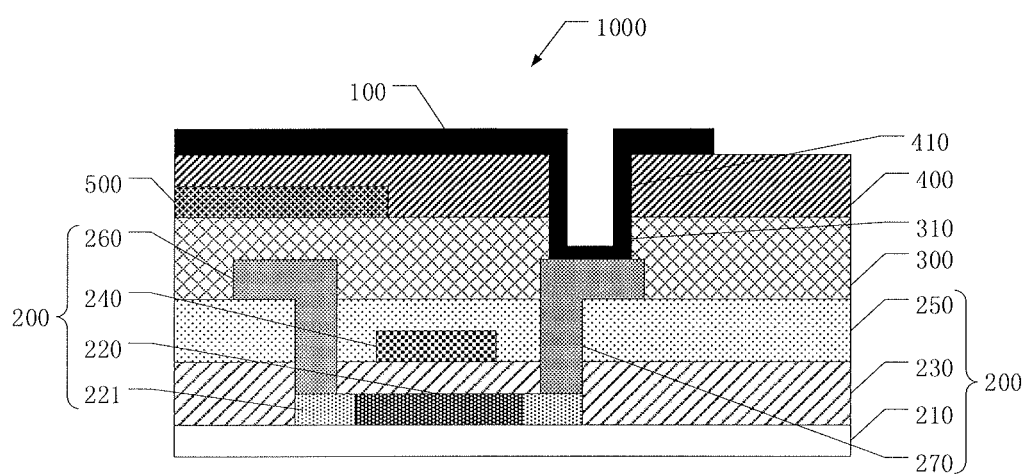
FIG. 4 is a diagram showing a structure of layers in a array substrate according to the first to the third embodiments.

As shown in FIG. 4, a array substrate 1000 is provided. The array substrate 1000 comprises a thin film transistor (TFT) structure layer 200, a flat layer 300, a passivation layer 400 and the above-mentioned pixel electrode 100.

The TFT structure layer 200 comprises a substrate 210, a active layer 220, a first insulating layer 230, a gate layer 240, a second insulating layer 250, and a source/drain layer 260.

The substrate 210 is an insulating substrate. The material of the substrate 210 could be glass or quartz to protect the entire structure of the array substrate 1000.

The active layer 220 is positioned on the substrate 210. There is one doped region 221 at each of the two ends of the active layer 220. The doped region 221 could be implemented by ion doping techniques. For example, the doped regions 221, at two ends of the active layer 220, could be deeply doped with the same P/N type dopants. The doped region could reduce the resistance between the source/drain layer 260 and the active layer 220 such that the leakage current of the array substrate 1000 could be reduced and the performance of the array substrate 1000 could be improved.

The first insulating layer 230 is positioned on the substrate 210 and covers the active layer 220. The first insulating layer 230 could be deposited by insulating material, such as silicon oxide, silicon nitride or silicon oxynitride. The first insulating layer 230 is used to protect and isolate the active layer 220.

The gate layer 240 is positioned on the first insulating layer 230 and corresponds to the active layer 220. The gate layer 240 is implemented by a conducting material, such as tungsten, chromium, aluminum, or copper. The gate layer 240 receives a voltage to create an electric field to change the thickness of the channel to further control the current of the source/drain layer 260.

The second insulating layer 250 is positioned on the first insulating layer 230 and covers the gate layer 240. The second insulating layer 250 could be implemented through a chemical vapor deposition (CVD) technique. The second insulating layer 250 could be also implemented through a dielectric isolation technique. Further, the second insulating layer 250 could be also implemented by an insulating material, such us silicon oxide, silicon nitride or silicon oxynitride. The second insulating 250 is used to isolate metal interconnections, such as the metal layer in the gate layer 240 or the source/drain layer 260, to prevent the gate layer 240 and the source/drain layer 260 form a short circuit.

The TFT structure layer 200 further comprises a via 270. The via 270 passes through the first insulating layer 230 from the second insulating layer 250 to the active layer 220. The vias 270 respectively correspond to the doped regions 221 at the two ends of the active layer 220. The aperture of the via 270 is less than 5 microns.

The source/drain layer 260 is positioned on the second insulating layer 250. The source/drain layer 260 could be formed by patterning a metal layer. The source/drain layer 260 is connected to the doped region 221 through the via 270.

The flat layer 300 is positioned on the second insulating layer 250 of the TFT structure layer 200 and covers the source/drain layer 260. The flat layer 300 is normally implemented by organic material and is used for planarizing the TFT structure layer 200 and for protecting the source/drain layer 260 from being short or corrosion.

The passivation layer 400 is positioned on the flat layer 300. There is a common electrode 500 between the passivation layer 400 and the flat layer 300. The passivation layer 400 is used to passivate the common electrode 500 to prevent the common electrode 500 from being short or corrosion.

The flat layer 300 comprises a first via 310. The passivation layer 400 comprises a second via 410. The first via 310 corresponds to the second via 410. The aperture of the first via 310 is less than 7 microns and the aperture of the second via is less than 5 microns.

The pixel electrode 100 is positioned on the passivation layer 400 and is connected to the source/drain layer 260 through the first via 310 and the second via 410.

In this embodiment, the two ends of the pixel electrode 100 are designed as inflated portions. However, the two ends of the pixel electrode 100 might be covered by the vias of the common electrode 500. This makes the inflated portions less effect. In this embodiment, the sizes of the vias 500 could be further reduced to eliminate the dark lines. Further, the other layers of the array substrate 1000 could be adjusted. Here, the aperture of the via of the common electrode 500 is less than 13 microns. The width of the wire of the source/drain layer 260 is less than 10 microns. The aperture of the first via 310 of the flat layer 300 is less than 7 microns. The second via 410 of the passivation layer 400 is less than 5 microns. The aperture of the contact hole 270 of the second insulting layer 250 is less than 5 microns.

In this embodiment, the array substrate 1000 is a 10 photo engraving process (PEP) back-channel etched structure. In another embodiment, the array substrate 1000 could be other structures, such as 12 PEP back-channel etched structure, 9 PEP back-channel etched structure, or 8 PEP back-channel etched structure. These above modifications of the pixel electrode 100 are similar to the above-mentioned 10 PEP back-channel etched structure and thus omitted here.

Further, a display device is provided (not shown). The display device comprises the above-mentioned pixel electrode 100 and the array substrate 1000. The display device could be an LCD display device, a cell phone, a laptop, a digital camera, a navigator or any other products or devices that have a displaying function.

The present invention provides a pixel electrode 100. Because the two ending parts 122 and 123 at two ends of the hollow region 120 are designed as inflated region, the distribution of the liquid crystals at the edge is more effective such that the transparence is improved and the contrast and the power consumption are improved accordingly. In addition, the present invention provides a array substrate 1000. The via of certain layers is adjusted according to the increase of the two ending parts of the hollow regions 120 of the pixel electrode. This could reduce the dark lines and raises the transparence.

Embodiment 2

A pixel electrode 100 is provided. The pixel electrode 100 is in bar shape.

Figure 2:
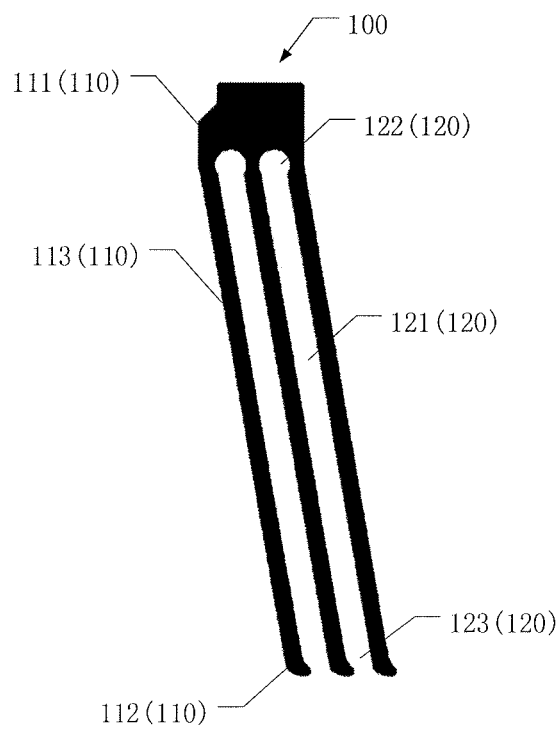
FIG. 2 is a diagram of a pixel electrode according to a second embodiment of the present invention.

As shown in FIG. 2, in this embodiment, the pixel electrode 100 comprises an electrode region 110 and two hollow regions 120. The hollow regions 120 are uniformly distributed within the electrode region 110.

The electrode region 110 comprises a first contact part 111, three second contact parts 112 and three connecting parts 113. The connecting parts 113 are in a bar shape and are parallel to each other. In addition, the connecting parts 113 and the hollow regions 120 are positioned in turns. The first contact part 111 and the second contact part 112 are respectively positioned at two ends of the connecting parts 113. Each of the second contact parts 112 forms a corner and the edge of the corner is in a curved shape. The second contact parts 112 are respectively positioned at one end of the connecting parts 113. Further, the corners formed by the second contact parts 112 are toward to the same direction. The first contact part 111 and the second contact part 112 are used to connect to the structure layer of the array substrate and the connecting part 113 is used to transmit currents.

The hollow regions 120 are uniformly distributed within the pixel electrode 100 and parallel to each other. Each of the hollow regions 120 comprises a main body part 121 and ending parts 122 and 123 respectively positioned at two ends of the main body part 121. The main body part 121 is in bar shape and has a width. The ending part 122 at one end of the hollow region 120 is an inflated portion. The hollow regions 120 forms a hollowed gap near the ending part 123 of the second contact part 112 such that the second contact part 112 forms the above-mentioned corner. The inflated portion has a width. The width of the main body part 121 is less than the width of the ending parts 122 and 123. Further, the above-mentioned inflated portions have a curved shape. The hollow region 120 is used to provide lights to the display panel because the light generated from the backlight could pass through the hollow region 120.

The material of the pixel electrode 100 is Indium tin oxide (ITO). The pixel electrode 100 improves the distribution of the liquid crystals through enlarging the ending parts 122 and 123 at the two ends of the hollow regions 120. This also reduces the dark lines of the display region and increases the transparence of the display.

In this embodiment, the pixel electrode 100 is a one-pixel dual-domain structure. This is not a limitation of the present invention. In another embodiment, the pixel electrode 100 could be another structure, such as dual-pixel dual-domain structure. In such structure, the implementation of the hollow region and the electrode region could be similar to those in the above-mentioned pixel electrode 100 and thus further illustrations are omitted here. Other modifications also fall within the scope of the present invention.

As shown in FIG. 4, a array substrate 1000 is provided. The array substrate 1000 comprises a thin film transistor (TFT) structure layer 200, a flat layer 300, a passivation layer 400 and the above-mentioned pixel electrode 100.

The TFT structure layer 200 comprises a substrate 210, a active layer 220, a first insulating layer 230, a gate layer 240, a second insulating layer 250, and a source/drain layer 260.

The substrate 210 is an insulating substrate. The material of the substrate 210 could be glass or quartz to protect the entire structure of the array substrate 1000.

The active layer 220 is positioned on the substrate 210. There is one doped region 221 at each of the two ends of the active layer 220. The doped region 221 could be implemented by ion doping techniques. For example, the doped regions 221, at two ends of the active layer 220, could be deeply doped with the same P/N type dopants. The doped region could reduce the resistance between the source/drain layer 260 and the active layer 220 such that the leakage current of the array substrate 1000 could be reduced and the performance of the array substrate 1000 could be improved.

The first insulating layer 230 is positioned on the substrate 210 and covers the active layer 220. The first insulating layer 230 could be deposited by insulating material, such as silicon oxide, silicon nitride or silicon oxynitride. The first insulating layer 230 is used to protect and isolate the active layer 220.

The gate layer 240 is positioned on the first insulating layer 230 and corresponds to the active layer 220. The gate layer 240 is implemented by a conducting material, such as tungsten, chromium, aluminum, or copper. The gate layer 240 receives a voltage to create an electric field to change the thickness of the channel to further control the current of the source/drain layer 260.

The second insulating layer 250 is positioned on the first insulating layer 230 and covers the gate layer 240. The second insulating layer 250 could be implemented through a chemical vapor deposition (CVD) technique. The second insulating layer 250 could be also implemented through a dielectric isolation technique. Further, the second insulating layer 250 could be also implemented by an insulating material, such us silicon oxide, silicon nitride or silicon oxynitride. The second insulating 250 is used to isolate metal interconnections, such as the metal layer in the gate layer 240 or the source/drain layer 260, to prevent the gate layer 240 and the source/drain layer 260 form a short circuit.

The TFT structure layer 200 further comprises a via 270. The via 270 passes through the first insulating layer 230 from the second insulating layer 250 to the active layer 220. The vias 270 respectively correspond to the doped regions 221 at the two ends of the active layer 220. The aperture of the via 270 is less than 5 microns.

The source/drain layer 260 is positioned on the second insulating layer 250. The source/drain layer 260 could be formed by patterning a metal layer. The source/drain layer 260 is connected to the doped region 221 through the via 270.

The flat layer 300 is positioned on the second insulating layer 250 of the TFT structure layer 200 and covers the source/drain layer 260. The flat layer 300 is normally implemented by organic material and is used for planarizing the TFT structure layer 200 and for protecting the source/drain layer 260 from being short or corrosion.

The passivation layer 400 is positioned on the flat layer 300. There is a common electrode 500 between the passivation layer 400 and the flat layer 300. The passivation layer 400 is used to passivate the common electrode 500 to prevent the common electrode 500 from being short or corrosion.

The flat layer 300 comprises a first via 310. The passivation layer 400 comprises a second via 410. The first via 310 corresponds to the second via 410. The aperture of the first via 310 is less than 7 microns and the aperture of the second via is less than 5 microns.

The pixel electrode 100 is positioned on the passivation layer 400 and is connected to the source/drain layer 260 through the first via 310 and the second via 410.

In this embodiment, one end of the pixel electrode 100 is designed as an inflated portion and the other end is designed to have a gap. However, the two ends of the pixel electrode 100 might be covered by the vias of the common electrode 500. This makes the inflated portions less effect. In this embodiment, the sizes of the vias 500 could be further reduced to eliminate the dark lines. Further, the other layers of the array substrate 1000 could be adjusted. Here, the aperture of the via of the common electrode 500 is less than 13 microns. The width of the wire of the source/drain layer 260 is less than 10 microns. The aperture of the first via 310 of the flat layer 300 is less than 7 microns. The second via 410 of the passivation layer 400 is less than 5 microns. The aperture of the contact hole 270 of the second insulting layer 250 is less than 5 microns.

In this embodiment, the array substrate 1000 is a 10 photo engraving process (PEP) back-channel etched structure. In another embodiment, the array substrate 1000 could be other structures, such as 12 PEP back-channel etched structure, 9 PEP back-channel etched structure, or 8 PEP back-channel etched structure. These above modifications of the pixel electrode 100 are similar to the above-mentioned 10 PEP back-channel etched structure and thus omitted here.

Further, a display device is provided (not shown). The display device comprises the above-mentioned pixel electrode 100 and the array substrate 1000. The display device could be an LCD display device, a cell phone, a laptop, a digital camera, a navigator or any other products or devices that have a displaying function.

The present invention provides a pixel electrode 100. Because the ending parts 122 are designed inflated regions and the ending parts 123 are designed as corners and to have a gap extending to the second contact part 112, the distribution of the liquid crystals at the edge is more effective such that the transparence is improved and the contrast and the power consumption are improved accordingly. In addition, the present invention provides a array substrate 1000. The via of certain layers is adjusted according to the increase of the two ending parts of the hollow regions 120 of the pixel electrode. This could reduce the dark lines and raises the transparence.

Embodiment 3

A pixel electrode 100 is provided. The pixel electrode 100 is in V-shaped.

Figure 3:
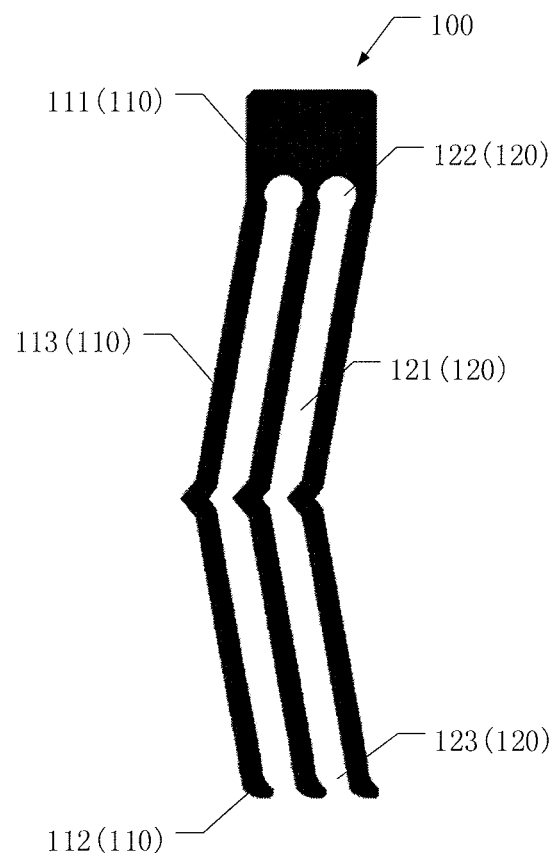
FIG. 3 is a diagram of a pixel electrode according to a third embodiment of the present invention.

As shown in FIG. 3, in this embodiment, the pixel electrode 100 comprises an electrode region 110 and two hollow regions 120. The hollow regions 120 are uniformly distributed within the electrode region 110.

The electrode region 110 comprises a first contact part 111, three second contact parts 112 and three connecting parts 113. The connecting parts 113 are in V-shaped and are parallel to each other. In addition, the connecting parts 113 and the hollow regions 120 are positioned in turns. The first contact part 111 and the second contact part 112 are respectively positioned at two ends of the connecting parts 113. Each of the second contact parts 112 forms a corner and the edge of the corner is in a curved shape. The second contact parts 112 are respectively positioned at one end of the connecting parts 113. Further, the corners formed by the second contact parts 112 are toward to the same direction. The first contact part 111 and the second contact part 112 are used to connect to the structure layer of the array substrate and the connecting part 113 is used to transmit currents.

The hollow regions 120 are uniformly distributed within the pixel electrode 100 and parallel to each other. Each of the hollow regions 120 comprises a main body part 121 and ending parts 122 and 123 respectively positioned at two ends of the main body part 121. The main body part 121 is in V-shaped and has a width. The ending part 122 at one end of the hollow region 120 is an inflated portion. The hollow regions 120 forms a hollowed gap near the ending part 123 of the second contact part 112 such that the second contact part 112 forms the above-mentioned corner. The inflated portion has a width. The width of the main body part 121 is less than the width of the ending parts 122 and 123. Further, the above-mentioned inflated portions have a curved shape. The hollow region 120 is used to provide lights to the display panel because the light generated from the backlight could pass through the hollow region 120.

The material of the pixel electrode 100 is Indium tin oxide (ITO). The pixel electrode 100 improves the distribution of the liquid crystals through enlarging the ending parts 122 and 123 at the two ends of the hollow regions 120. This also reduces the dark lines of the display region and increases the transparence of the display.

In this embodiment, the pixel electrode 100 is a one-pixel dual-domain structure. This is not a limitation of the present invention. In another embodiment, the pixel electrode 100 could be another structure, such as dual-pixel dual-domain structure. In such structure, the implementation of the hollow region and the electrode region could be similar to those in the above-mentioned pixel electrode 100 and thus further illustrations are omitted here. Other modifications also fall within the scope of the present invention.

As shown in FIG. 4, a array substrate 1000 is provided. The array substrate 1000 comprises a thin film transistor (TFT) structure layer 200, a flat layer 300, a passivation layer 400 and the above-mentioned pixel electrode 100.

The TFT structure layer 200 comprises a substrate 210, a active layer 220, a first insulating layer 230, a gate layer 240, a second insulating layer 250, and a source/drain layer 260.

The substrate 210 is an insulating substrate. The material of the substrate 210 could be glass or quartz to protect the entire structure of the array substrate 1000.

The active layer 220 is positioned on the substrate 210. There is one doped region 221 at each of the two ends of the active layer 220. The doped region 221 could be implemented by ion doping techniques. For example, the doped regions 221, at two ends of the active layer 220, could be deeply doped with the same P/N type dopants. The doped region could reduce the resistance between the source/drain layer 260 and the active layer 220 such that the leakage current of the array substrate 1000 could be reduced and the performance of the array substrate 1000 could be improved.

The first insulating layer 230 is positioned on the substrate 210 and covers the active layer 220. The first insulating layer 230 could be deposited by insulating material, such as silicon oxide, silicon nitride or silicon oxynitride. The first insulating layer 230 is used to protect and isolate the active layer 220.

The gate layer 240 is positioned on the first insulating layer 230 and corresponds to the active layer 220. The gate layer 240 is implemented by a conducting material, such as tungsten, chromium, aluminum, or copper. The gate layer 240 receives a voltage to create an electric field to change the thickness of the channel to further control the current of the source/drain layer 260.

The second insulating layer 250 is positioned on the first insulating layer 230 and covers the gate layer 240. The second insulating layer 250 could be implemented through a chemical vapor deposition (CVD) technique. The second insulating layer 250 could be also implemented through a dielectric isolation technique. Further, the second insulating layer 250 could be also implemented by an insulating material, such us silicon oxide, silicon nitride or silicon oxynitride. The second insulating 250 is used to isolate metal interconnections, such as the metal layer in the gate layer 240 or the source/drain layer 260, to prevent the gate layer 240 and the source/drain layer 260 form a short circuit.

The TFT structure layer 200 further comprises a via 270. The via 270 passes through the first insulating layer 230 from the second insulating layer 250 to the active layer 220. The vias 270 respectively correspond to the doped regions 221 at the two ends of the active layer 220. The aperture of the via 270 is less than 5 microns.

The source/drain layer 260 is positioned on the second insulating layer 250. The source/drain layer 260 could be formed by patterning a metal layer. The source/drain layer 260 is connected to the doped region 221 through the via 270.

The flat layer 300 is positioned on the second insulating layer 250 of the TFT structure layer 200 and covers the source/drain layer 260. The flat layer 300 is normally implemented by organic material and is used for planarizing the TFT structure layer 200 and for protecting the source/drain layer 260 from being short or corrosion.

The passivation layer 400 is positioned on the flat layer 300. There is a common electrode 500 between the passivation layer 400 and the flat layer 300. The passivation layer 400 is used to passivate the common electrode 500 to prevent the common electrode 500 from being short or corrosion.

The flat layer 300 comprises a first via 310. The passivation layer 400 comprises a second via 410. The first via 310 corresponds to the second via 410. The aperture of the first via 310 is less than 7 microns and the aperture of the second via is less than 5 microns.

The pixel electrode 100 is positioned on the passivation layer 400 and is connected to the source/drain layer 260 through the first via 310 and the second via 410.

In this embodiment, the two ends of the pixel electrode 100 are designed as inflated portions. However, the two ends of the pixel electrode 100 might be covered by the vias of the common electrode 500. This makes the inflated portions less effect. In this embodiment, the sizes of the vias 500 could be further reduced to eliminate the dark lines. Further, the other layers of the array substrate 1000 could be adjusted. Here, the aperture of the via of the common electrode 500 is less than 13 microns. The width of the wire of the source/drain layer 260 is less than 10 microns. The aperture of the first via 310 of the flat layer 300 is less than 7 microns. The second via 410 of the passivation layer 400 is less than 5 microns. The aperture of the contact hole 270 of the second insulting layer 250 is less than 5 microns.

In this embodiment, the array substrate 1000 is a 10 photo engraving process (PEP) back-channel etched structure. In another embodiment, the array substrate 1000 could be other structures, such as 12 PEP back-channel etched structure, 9 PEP back-channel etched structure, or 8 PEP back-channel etched structure. These above modifications of the pixel electrode 100 are similar to the above-mentioned 10 PEP back-channel etched structure and thus omitted here.

Further, a display device is provided (not shown). The display device comprises the above-mentioned pixel electrode 100 and the array substrate 1000. The display device could be an LCD display device, a cell phone, a laptop, a digital camera, a navigator or any other products or devices that have a displaying function.

The present invention provides a pixel electrode 100. Because the ending parts 122 are designed inflated regions and the ending parts 123 are designed as corners and to have a gap extending to the second contact part 112, the distribution of the liquid crystals at the edge is more effective such that the transparence is improved and the contrast and the power consumption are improved accordingly. In addition, the present invention provides a array substrate 1000. The via of certain layers is adjusted according to the increase of the two ending parts of the hollow regions 120 of the pixel electrode. This could reduce the dark lines and raises the transparence.

Above are embodiments of the present invention, which does not limit the scope of the present invention. Any modifications, equivalent replacements or improvements within the spirit and principles of the embodiment described above should be covered by the protected scope of the invention.

What is claimed is:

1. A pixel electrode comprising:
an electrode region comprising a first contact part and a plurality of second contact parts, wherein each of the plurality of second contact parts forms a corner and an edge of the corner is in a curved shape, and the corners formed by the plurality of second contact parts are toward to the same direction; and
a first hollow region and a second hollow region, distributed within the electrode region; wherein the first hollow region is adjacent to the second hollow region, and each of the first hollow region and the second hollow region comprises a main body part and first and second ending parts respectively located at two ends of the main body part, wherein for each of the first and second hollow regions, the first ending part is an inflated portion having a width, and a width of the main body part is smaller than the width of the inflated portion, wherein the second ending parts of the first and second hollow regions extend to the plurality of second connect parts and forms a hollowed gap near the plurality of second connect parts such that the plurality of second connect parts form the corners.

2. The pixel electrode of claim 1, wherein the inflated portion has a curved shape.

3. The pixel electrode of claim 1, wherein the pixel electrode is in V-shaped.

4. The pixel electrode of claim 1, wherein the main body part is in V-shaped.

5. The pixel electrode of claim 1, wherein the electrode region form three corners at the hollowed gap, and an edge of the corner has a curved shape.

6. An array substrate, comprising a pixel electrode, the pixel electrode comprising:
an electrode region comprising a first contact part and a plurality of second contact parts, wherein each of the plurality of second contact parts forms a corner and an edge of the corner is in a curved shape, and the corners formed by the plurality of second contact parts are toward to the same direction; and
a first hollow region and a second hollow adj region, distributed within the electrode region; wherein the first hollow region is adjacent to the second hollow region, and each of the first hollow region and the second hollow region comprises a main body part and first and second ending parts respectively located at two ends of the main body part, wherein for each of the first and second hollow regions, the first ending part is an inflated portion having a width, and a width of the main body part is smaller than the width of the inflated portion, wherein the second ending parts of the first and second hollow regions extend to the plurality of second connect parts and forms a hollowed gap near the plurality of second connect parts such that the plurality of second connect parts form the corners.

7. The array substrate of claim 6, comprising:
a thin film transistor (TFT) structure layer;
a flat layer, positioned on the TFT structure layer; and
a passivation layer, positioned on the flat layer;
wherein the pixel electrode is positioned on the passivation layer.

8. The array substrate of claim 7, wherein the TFT structure layer comprises a source/drain layer, the flat layer comprises a first via, the passivation layer has a second via, the first via corresponds to the second via, the pixel electrode is coupled to the source/drain layer through the first via and the second via.

9. The array substrate of claim 8, wherein an aperture of the first via is less than 7 microns and an aperture of the second via is less than 5 microns.

10. A display device, comprising a pixel electrode, the pixel electrode comprising:
an electrode region comprising a first contact part and a plurality of second contact parts, wherein each of the plurality of second contact parts forms a corner and an edge of the corner is in a curved shape, and the corners formed by the plurality of second contact parts are toward to the same direction; and
a first hollow region and a second hollow region, distributed within the electrode region; wherein the first hollow region is adjacent to the second hollow region, and each of the first hollow region and the second hollow region comprises a main body part and first and second ending parts respectively located at two ends of the main body part, wherein for each of the first and second hollow regions, the first ending part is an inflated portion having a width, and a width of the main body part is smaller than the width of the inflated portion, wherein the second ending parts of the first and second hollow regions extend to the plurality of second connect parts and forms a hollowed gap near the plurality of second connect parts such that the plurality of second connect parts form the corners.

* * * * *